United States Patent
Low et al.

(10) Patent No.: US 7,394,280 B1
(45) Date of Patent: Jul. 1, 2008

(54) METHOD OF ELECTRO MIGRATION TESTING

(75) Inventors: Yong Han Frankie Low, Lengkong Tiga (SG); Kwang Ye Sim, Jalan Membina (SG); Eu Gene Glen Foo, Edgedale Plains (SG)

(73) Assignee: Systems on Silicon Manufacturing Co. Pte. Ltd., Singapore (SG)

( * ) Notice: Subject to any disclaimer, the term of this patent is extended or adjusted under 35 U.S.C. 154(b) by 0 days.

(21) Appl. No.: 11/671,947

(22) Filed: Feb. 6, 2007

(51) Int. Cl.
*G01R 31/26* (2006.01)
*G01R 27/08* (2006.01)

(52) U.S. Cl. .................. 324/765; 324/716; 324/719
(58) Field of Classification Search .................. None
See application file for complete search history.

*Primary Examiner*—Ha Tran Nguyen
*Assistant Examiner*—Trung Q. Nguyen
(74) *Attorney, Agent, or Firm*—Harness, Dickey & Pierce, P.L.C.

(57) ABSTRACT

A method of determining the time to failure of parallel electro migration test structures is described. The method generally includes the steps of: measuring the resistance of the complete structure; calculating the resistance of the n individual parallel structures from the measured resistance; calculating the resistance of the complete structure after the failure of m individual parallel structures, for m=1 to n; and recording the time of failure for each m as the time when the resistance is approximately the value predicted for m fails.

8 Claims, 6 Drawing Sheets

METHOD OF ELECTRO MIGRATION TESTING

FIELD

Figure 1:
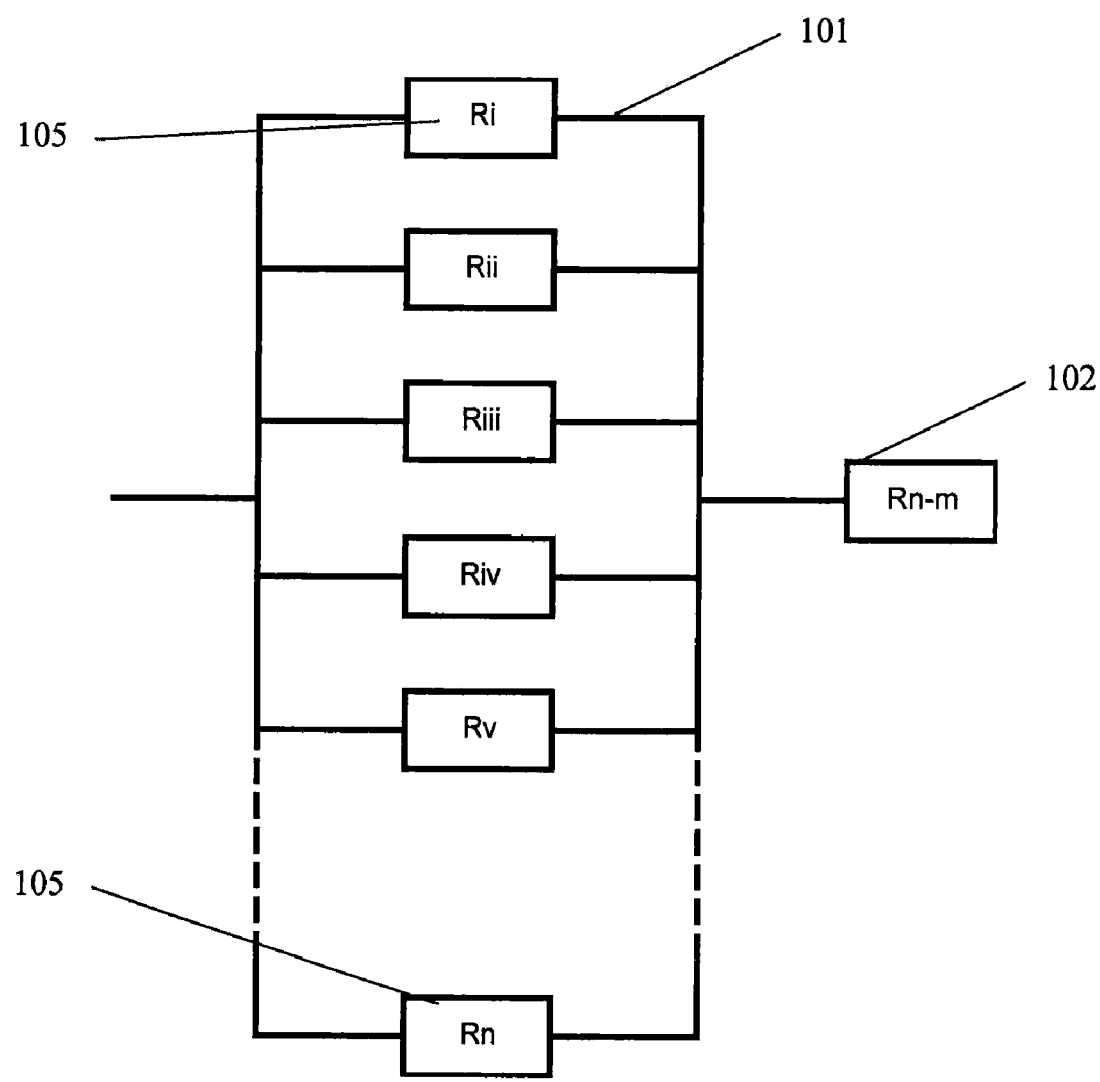

The present invention generally relates to methods for determining the reliability of metal interconnects in wafers.

BACKGROUND

The statements in this section merely provide background information related to the present disclosure and may not constitute prior art.

Electro migration tests are used as a backend test in fabrication plants to determine the reliability of metal interconnects. Commonly, electro migration is performed at a package level (EM), or electro migration is performed at the wafer level (WLEM).

In either case, multiple test sites are required for testing to ensure sufficient time to fail data can be gathered to access the reliability of the process. The necessity to use multiple test sites increases the number of hours of testing and therefore the expense of testing. Reducing the number of sites needed to obtain similar results would result in significant cost and time savings.

During electro migration testing, the resistance of the structure under test is monitored while the structure is stressed. Stressing of the structure involves the use of a constant temperature and forcing a constant current through the structure.

SUMMARY

According to various aspects of the present disclosure, exemplary methods are provided for determining the reliability of metal interconnects in wafers that may overcome at least some of the disadvantages of existing systems and methods, or at least provide industry with a useful choice.

In a first embodiment of the present disclosure, there is provided a method of determining the time to failure of an electro migration test structure made up of n individual parallel structures. In this first embodiment, the method may generally include the steps of:

measuring the resistance of said electro migration test structure;
calculating the resistance of said n individual parallel structures from said measured resistance;
calculating the resistance of the electro migration test structure after the failure of m individual parallel structures, for m=1 to n; and
recording the time of failure for each m as the time when the resistance is approximately the value predicted for m fails.

In some embodiments, the time to failure may be predicted from a single electro migration test structure made up of n individual parallel structures.

In some embodiments, all of the parallel structures may share the same structural characteristics.

In a second embodiment of the present disclosure, there is provided a method of comparing the reliability of metal interconnects in batches of wafers. In this second embodiment, the method may generally include the steps of:

calculating the time to fail of m individual parallel structures using the method of the first embodiment for a plurality of wafer batches using at least one wafer in a wafer batch;
graphing the calculated data for each batch of wafers; and
comparing the graphs of said plurality of batches.

In some embodiments, the time to failure may be predicted from a single electro migration test structure made up of n individual parallel structures.

In some embodiments, all of the parallel structures may share the same structural characteristics.

Embodiments of the present invention may further be said to include in any alternative combination of parts or features mentioned herein or shown in the accompanying drawings. Known equivalents of these parts or features which are not expressly set out are nevertheless deemed to be included.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

Figure 2:
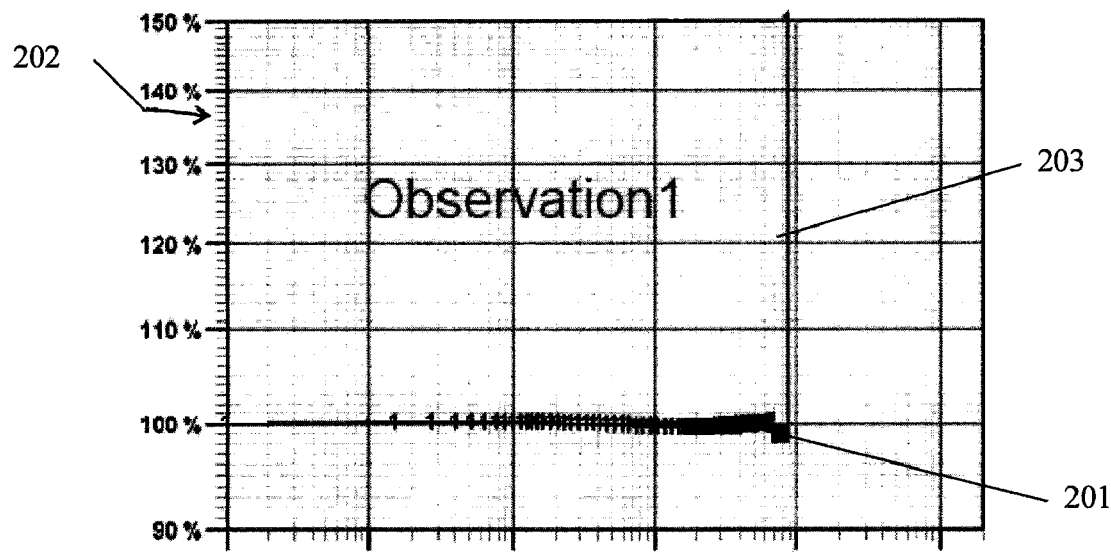
Figure 3:
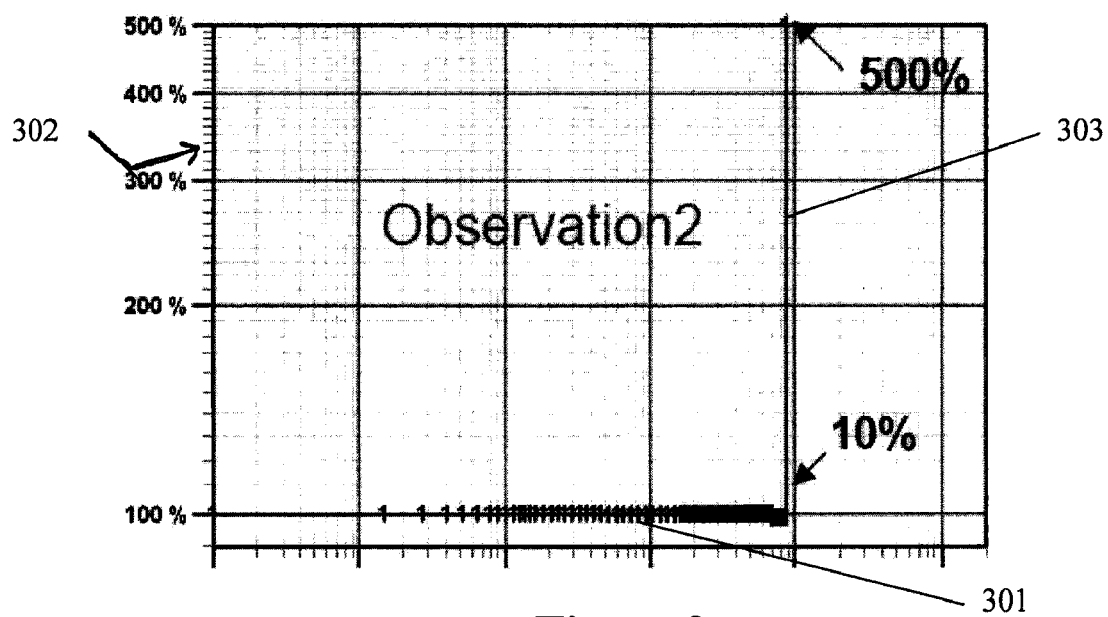
Figure 6:
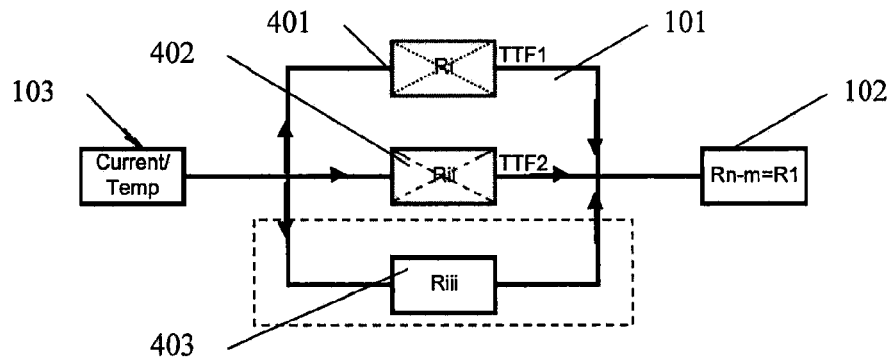
Figure 7:
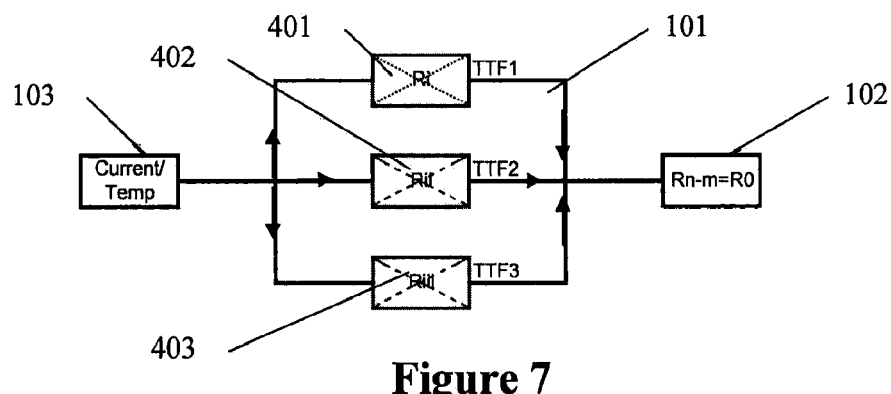
Figure 8:
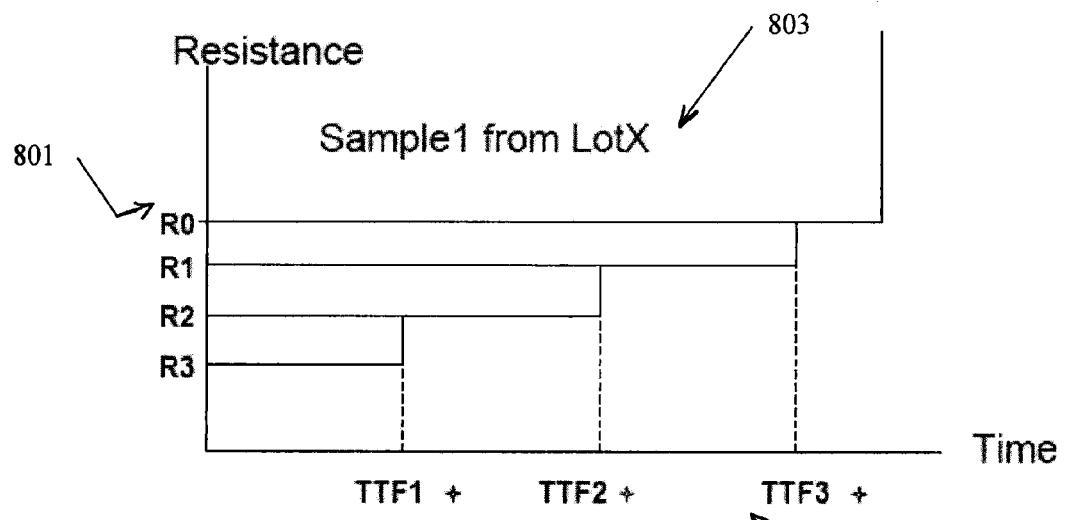
Figure 9:
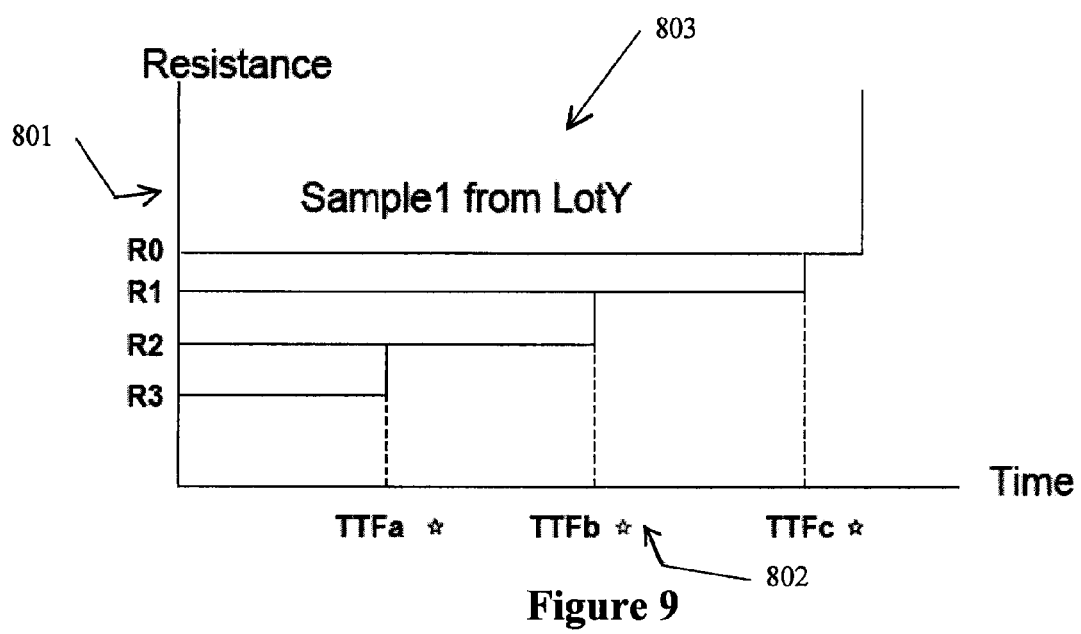
Figure 10:
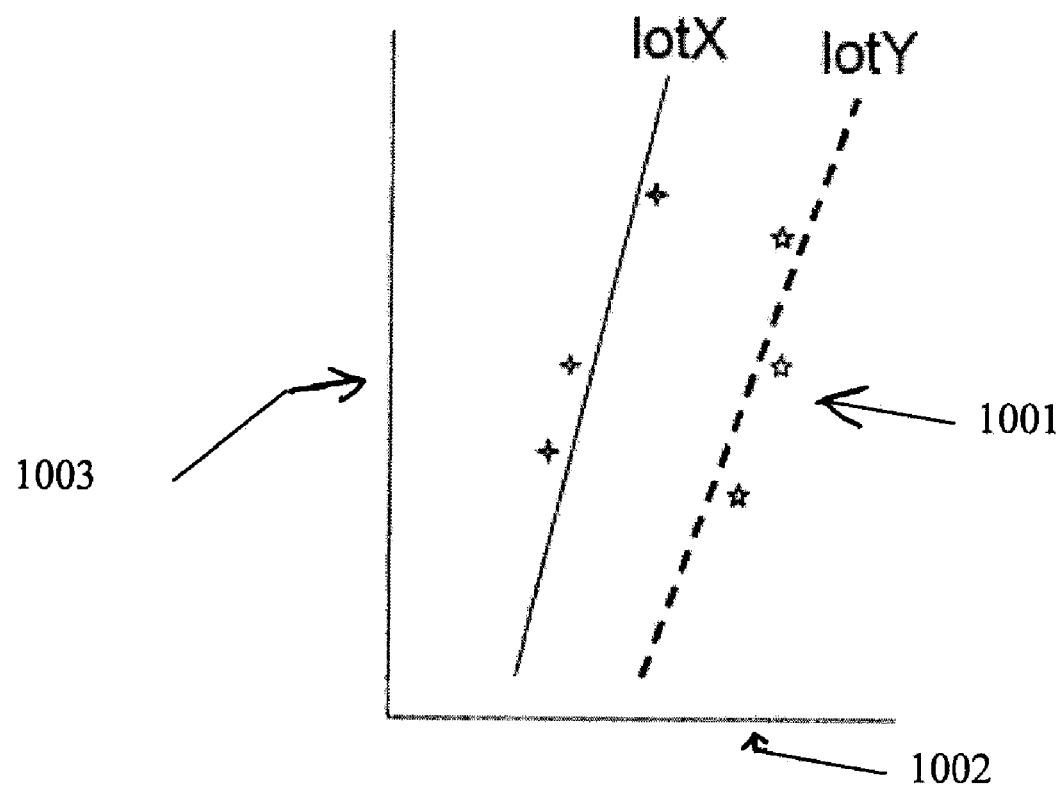
Figure 11:
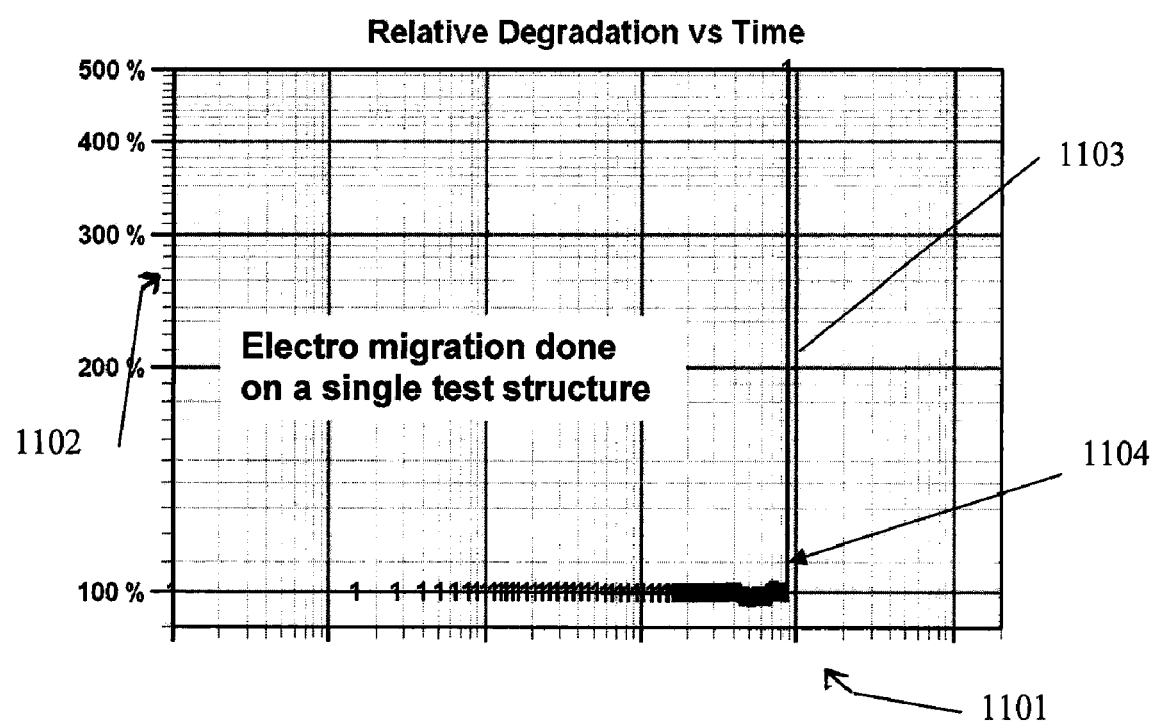

One embodiment of the present invention will now be described with reference to the accompanying drawings in which:

FIG. 1 is a schematic diagram of a test structure according to an exemplary embodiment of the present invention, FIGS. 2 and 3 are graphs of observed typical package level electro migration tests, FIGS. 4 to 7 are schematic diagrams of a work example electro migration test, FIGS. 8 and 9 are graphs of example electrometric test carried out using a method embodiment of the present invention, FIG. 10 is a normalized log graph of the tests of FIGS. 8 and 9, and FIG. 11 is a relative degradation plot of a single test structure over time.

DETAILED DESCRIPTION

The following description is merely exemplary in nature and is not intended to limit the present disclosure, application, or uses. It should be understood that throughout the drawings, corresponding reference numerals indicate like or corresponding parts and features.

Referring to FIG. 1, a number of parallel metal interconnect structures are shown. All the parallel structures are assumed to share the same structural characteristics. The resistance of the total structure 101 needs to be measured. The total resistance $R_{n-m}$ 102 of the structure 101 is measured; where n is the total number of parallel structures, and m is the number of failed structures. $R_k$ 105 is the resistance of a single structure in the parallel test structure. Based on the total measured resistance $R_{n-m}$ 102, the resistance of individual test structures $R_k$ for k equal i to n $R_k$ 105 can be calculated as $nR_{n-m}$.

Further, the predicted total resistance $R_{n-m}$ of the test structure after the failure of individual structures $R_i$ to $R_n$ 105 can also be calculated. After the failure of one structure, the remaining predicted total resistance $R_{n-1}$ 102 is $R_n/n-1$.

A test structure is assumed to have failed when it is 'open', that is the structure no longer passes current. A predetermined stress involving both temperature and current is applied to the test structure. When the structure fails (typically by opening), the test is terminated.

To test a sample, the pre-stress resistance of the sample is first measured. Next, a pre-determined stress current and temperature 103 is applied. The resistance is monitored, and the time to fail of individual structure is determined based on the calculated resistance values. This allows for the testing of multiple structures using a single site.

FIGS. 2 and 3 show relative resistance plots 203, 303 from the same test structure. In FIG. 3, the scale of the y axis is extended to 500%. The x axis 201, 301 is time on a lognormal scale, and the y axis 202, 302 is the relative degradation of the circuit. This shows that when the test structure fails, the resistance value is the same at 50%, 150% or 500%. This is only applicable when the test is conducted using highly accelerated conditions using a high temperature and a high current. To see this kind of failure, a pre-determined stress condition is required.

Figure 4:
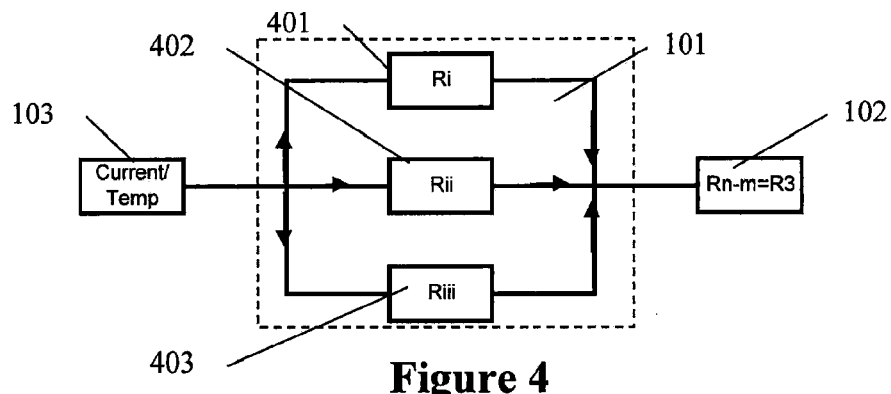

Referring to FIGS. 4 to 7, an example will be worked through. A test site that may be thought of as the total structure 101 has three parallel structures having the same structural characteristics. The structures are labeled $R_i$ 401, $R_{ii}$ 402, $R_{iii}$ 403. In FIG. 4, the total resistance $R_{n-m}$ 102 is first obtained from parametric measurement. $R_i = R_{ii} = R_{iii} = 3R_{n-m}$ as all the structures share the same characteristic. When one structure has failed $R2 = R_{n-1} = R_n/2$, and when two structures have failed $R1 = R_{n-2} = R_n$. When the last structure fails, the test site 101 will be open.

Figure 5:
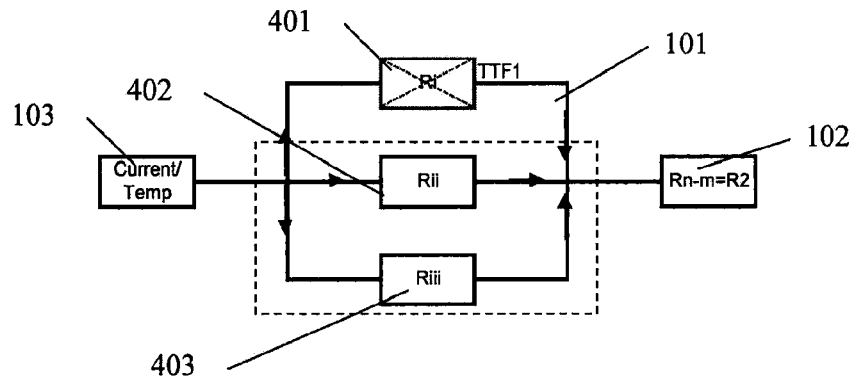

FIG. 5 illustrates one structure $R_i$ 401 as having failed. FIG. 6 illustrates two structures $R_i$ 401 and $R_{ii}$ 402 as having failed. FIG. 7 illustrates all the structures $R_i$ 401, $R_{ii}$ 402 and $R_{iii}$ 403 as having failed. In each case, the calculated predicted values are shown as $R_{n-m}$ 102.

FIGS. 8 and 9 illustrate the time to failure 803 for two samples Lotx and Loty. Each sample had three structures. The x axis 802 shows time, and the y axis 801 the resistance level. Test equipment is used to measure and record resistance overtime. As the first parallel structure failed, resistance increased from R3 to R2. As the second structure failed resistance increased from R2 to R1. And, as the final structure fails, resistance becomes total because the structure is open. When the first parallel test structure failed, the first time to fail TTF1/TTFa is extrapolated from the resistance over time plot at the calculated R2. Subsequently, when the second test structure failed, the time to fail TTF2/TTFb will be extrapolated at the calculated value R1. The last time to fail will be taken at the point TTF3/TTFc when the total structure opens.

FIG. 10 shows the failure times of Lots x and y 1001 plotted on a lognormal graph. The x axis 1002 shows time on a logarithmic scale, and the y axis 1003 is the cumulative percentage of fails.

FIG. 11 illustrates the degradation of a test circuit. In FIG. 11, the x axis 1101 shows time on a lognormal scale, and the y axis 1102 is the degradation in the circuit. The line 1103 shows that little movement occurs in the graph until the time to fail 1104.

Embodiments of the present invention are of particular use in a wafer fabrication foundry. In foundry situations, the ability to quickly and accurately test reliability of batches of wafers is important. The present invention is not primarily used to establish an accurate lifetime or time to fail. The present invention is primarily useful as a tool to quickly gauge the reliability of different batches. By plotting different batches on the same lognormal plot, different batches can be compared. A statistical control method for example 3sigma can be used to assess if a batch of production wafers can be released.

The foregoing description of exemplary embodiments of the invention have been presented for purposes of illustration and description. It is not intended to be exhaustive or to limit the invention to the precise forms disclosed, since many modifications or variations thereof are possible in light of the above teaching. All such modifications and variations are within the scope of the invention. The embodiments described herein were chosen and described in order best to explain the principles of the invention and its practical application, thereby to enable others skilled in the art to utilize the invention in various embodiments and with various modifications as are suited to the particular use contemplated thereof. It is intended that the scope of the invention be defined by the claims appended hereto, when interpreted in accordance with the full breadth to which they are legally and equitably suited.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. As used herein the term "and/or" means "and" or "or", or both. As used herein the term "(s)" following a noun includes, as might be appropriate, the singular or plural forms of that noun. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

What is claimed is:

1. A method of determining the time to failure of an electro migration test structure made up of n individual parallel structures, the method comprising the steps of:
    measuring the resistance of said electro migration test structure;
    calculating the resistance of said n individual parallel structures from said measured resistance;
    calculating the resistance of the electro migration test structure after the failure of m individual parallel structures, for m=1 to n; and
    recording the time of failure for each m as the time when the resistance is approximately the value predicted for m fails.

2. A method of determining the time to failure of parallel electro migration test structures as claimed in claim 1 wherein the time to failure can be predicted from a single electro migration test structure made up of n individual parallel structures.

3. A method of determining the time to failure of parallel electro migration test structures as claimed in claim 1 wherein all the said parallel structures share the same structural characteristics.

4. A method of determining the time to failure of parallel electro migration test structures as claimed in claim 3 wherein all the said parallel structures share the same structural characteristics.

5. A method of comparing the reliability of metal interconnects in batches of wafers, the method comprising the steps of:
    calculating the time to fail of m individual parallel structures using the method of claim 1 for a plurality of wafer batches using at least one wafer in a wafer batch;
    graphing the calculated data for each batch of wafers; and
    comparing the graphs of said plurality of batches.

6. A method of comparing the reliability of metal interconnects in batches of wafers as claimed in claim 5 wherein the time to failure can be predicted from a single electro migration test structure made up of n individual parallel structures.

7. A method of comparing the reliability of metal interconnects in batches of wafers as claimed in claim 6 wherein all the said parallel structures share the same structural characteristics.

8. A method of comparing the reliability of metal interconnects in batches of wafers as claimed in claim 5 wherein all the said parallel structures share the same structural characteristics.

* * * * *